United States Patent
Wang et al.

(10) Patent No.: US 7,256,603 B1
(45) Date of Patent: Aug. 14, 2007

(54) APPARATUS FOR MEASURING THE STATIC PARAMETERS OF INTEGRATED CIRCUITS

(75) Inventors: Bily Wang, Hsin Chu (TW); Chung-Ho Chen, Hsinchu (TW); Kuei-Pao Chen, Hsinchu (TW)

(73) Assignee: Youngtek Electronics Corporation, Hsinchu (TW)

( * ) Notice: Subject to any disclaimer, the term of this patent is extended or adjusted under 35 U.S.C. 154(b) by 0 days.

(21) Appl. No.: 11/475,147

(22) Filed: Jun. 27, 2006

(51) Int. Cl.
*G01R 31/26* (2006.01)

(52) U.S. Cl. ..................................... 324/765
(58) Field of Classification Search ............ None
See application file for complete search history.

(56) References Cited

U.S. PATENT DOCUMENTS 6,885,211 B1 *   4/2005   Thomsen et al. ........... 324/765
6,917,213 B2 *   7/2005   Oosawa et al. ............. 324/763

* cited by examiner

*Primary Examiner*—Ha Tran Nguyen
*Assistant Examiner*—Trung Q. Nguyen
(74) *Attorney, Agent, or Firm*—Rosenberg, Klein & Lee

(57) ABSTRACT

An apparatus for measuring the static parameters of integrated circuit is disclosed. When the apparatus is operated, the output mode is determined automatically according to the load of the integrated circuit. When the apparatus is operated in voltage output mode, the apparatus automatically limits the current. When the apparatus is operated at current output mode, the apparatus automatically limits the voltage. Therefore, the operation voltage and the operation current are stabilized. When the tested integrated circuit fails, the apparatus of the present invention can protect itself according to the stable operation voltage and operation current, and doesn't damage the tested integrated circuit.

10 Claims, 4 Drawing Sheets

APPARATUS FOR MEASURING THE STATIC PARAMETERS OF INTEGRATED CIRCUITS

BACKGROUND OF THE INVENTION

1. Field of the Invention

The present invention relates to an apparatus for measuring the static parameters of integrated circuits, and in particular, to an apparatus for measuring the static parameters of integrated circuits that automatically determines the output mode according to the load of the integrated circuits.

2. Description of the Related Art

The testing of integrated circuits usually includes electrical testing and functional testing of the integrated circuit. The electrical testing of the integrated circuit has to test the static parameters, including direct operation voltage testing, direct operation current, and leakage current, etc.

Please refer to FIG. 1, which shows a circuit diagram of an apparatus for measuring the static parameters of integrated circuits of the prior art. The measuring apparatus 1 is used for testing the static parameters of a tested integrated circuit 2. The measuring apparatus 1 includes a main control unit 10, an analog switch 12, a current sampling unit 14, a voltage-sampling unit 16 and a level-clamping protection unit 18. The main control unit 10 includes a capacitor C2, an operation amplifier OPA1, and a plurality of resistors R3, R4 and R5.

When the measuring apparatus 1 of the prior art is used for testing the tested integrated circuit 2, an output mode of the testing needs to be determined in advance. The output mode includes a voltage output mode and a current output mode. In FIG. 1, during operation in voltage output mode, an output voltage needs to be inputted into the main control unit 10. The main control unit 10 provides a voltage-testing signal to the tested integrated circuit 2 according to the output voltage. The voltage-sampling unit 16 obtains the voltage of the tested integrated circuit 2 and outputs a feedback voltage signal v_signal. The feedback voltage signal v_signal is fed back to the main control unit 10 via the analog switch 12. The current sampling unit 14 obtains the current flowing through the tested integrated circuit 2 via a programmable resistor 15 and outputs a feedback current signal i_signal.

In the voltage output mode, the main control unit 10 provides the voltage-testing signal to the tested integrated circuit 2, and achieves a stable negative feedback via the voltage feedback method. If the current flowing through the tested integrated circuit 2 is normal, the level-clamping protection unit 18 separates the feedback current signal i_signal from feeding back to the main control unit 10. If the current flowing through the tested integrated circuit 2 is abnormal, the level-clamping protection unit 18 outputs an inverse voltage that is bigger than the output voltage to the main control unit 10 to protect the measuring apparatus 1. Furthermore, the tester can obtain the operation current of the tested integrated circuit 2 according to the feedback current signal i_signal.

During operation in current output mode, the output current needs to be inputted into the main control unit 10. The main control unit 10 provides a current testing signal to the tested integrated circuit 2 according to the output current. The current sampling unit 14 obtains the current flowing through the tested integrated circuit 2 and outputs a feedback current signal i_signal. The feedback current signal i_signal is fed back to the main control unit 10 via the analog switch 12. The voltage-sampling unit 16 obtains the voltage of the tested integrated circuit 2 and outputs a feedback voltage signal v_signal.

In the current output mode, the main control unit 10 provides the current testing signal to the tested integrated circuit 2, and achieves a stable negative feedback via the current feedback method. Meanwhile, if the voltage of the tested integrated circuit 2 is normal, the level-clamping protection unit 18 prevents the feedback voltage signal v_signal from feeding back to the main control unit 10. If the voltage of the tested integrated circuit 2 is abnormal, the level-clamping protection unit 18 outputs an inverse current that is bigger than the output current to the main control unit 10 to protect the measuring apparatus 1. Furthermore, the tester can obtain the operation voltage of the tested integrated circuit 2 according to the feedback voltage signal v_signal.

The measuring apparatus 1 of the prior art uses the level-clamping protection unit 18 to protect the measuring apparatus 1. However, the level-clamping protection unit 18 generates an inverse voltage whose magnitude is larger than the operation voltage. The inverse voltage or current will damage the tested integrated circuit 2, and an unstable oscillation voltage is also generated and the operation condition will be misjudged.

FIG. 2 shows a waveform diagram of the operation current I of the measuring apparatus of the prior art operated at voltage output mode. When the measuring apparatus 1 is operated at voltage output mode, the operation current Im of the tested integrated circuit 2 has the ripple or oscillation waveform due to the operation of the level-clamping protection unit 18.

SUMMARY OF THE INVENTION

One particular aspect of the present invention is to provide an apparatus for measuring the static parameters of integrated circuits. When the apparatus is operated, the output mode is determined automatically according to the load of the integrated circuit. When the apparatus is operated at voltage output mode, the apparatus automatically limits the current. When the apparatus is in current output mode, the apparatus automatically limits the voltage. Therefore, the operation voltage and the operation current are stabilized. When the tested integrated circuit fails, the apparatus of the present invention can protect itself according to the stable operation voltage and operation current, and doesn't damage the tested integrated circuit.

An apparatus for measuring the static parameters of integrated circuit the present invention is used for testing the static parameters of a tested integrated circuit. The apparatus for measuring the static parameters of integrated circuit includes a mode-selecting switch, a main control unit, a current sampling unit, a voltage-sampling unit, a comparing unit, a logic-judging unit, and a feedback-selecting switch. The mode-selecting switch receives at least one limiting signal and outputs one of the limiting signals according to a mode-selecting signal. The main control unit provides a testing signal to the tested integrated circuit according to one of the limiting signals. The current sampling unit obtains the current flowing through the tested integrated circuit and outputs a current sampling signal. The voltage-sampling unit obtains the voltage of the tested integrated circuit and outputs a voltage-sampling signal. The comparing unit compares the current sampling signal and the voltage-sampling signal with the limiting signals to output a logic signal. The logic-judging unit receives the logic signal and outputs the mode-selecting signal. The feedback-selecting switch is connected with the main control unit, the current sampling unit, and the voltage-sampling unit. The feedback-selecting switch outputs one of either the current sampling signal or the voltage-sampling signal according to the mode-selecting signal.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
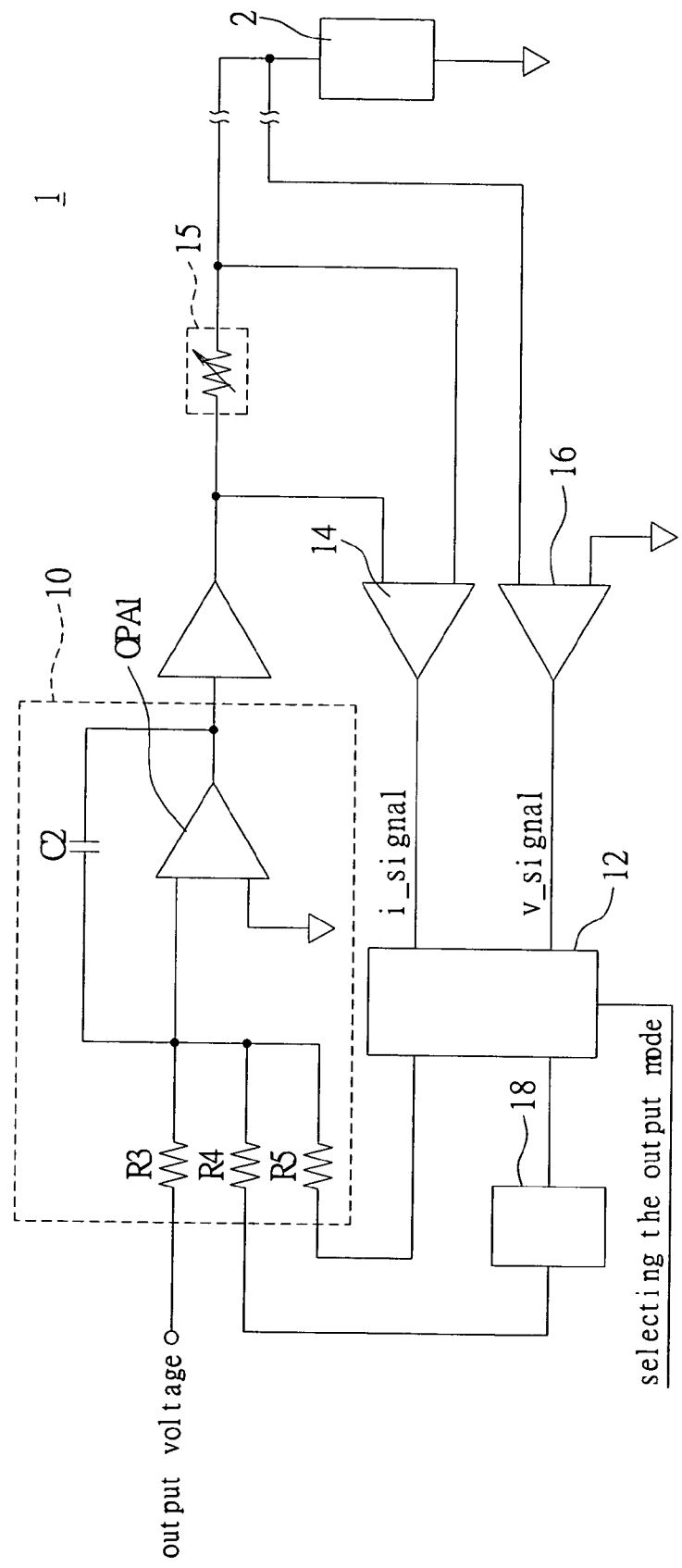
FIG. 1 is a circuit diagram of an apparatus for measuring the static parameters of integrated circuits of the prior art.
Figure 2:
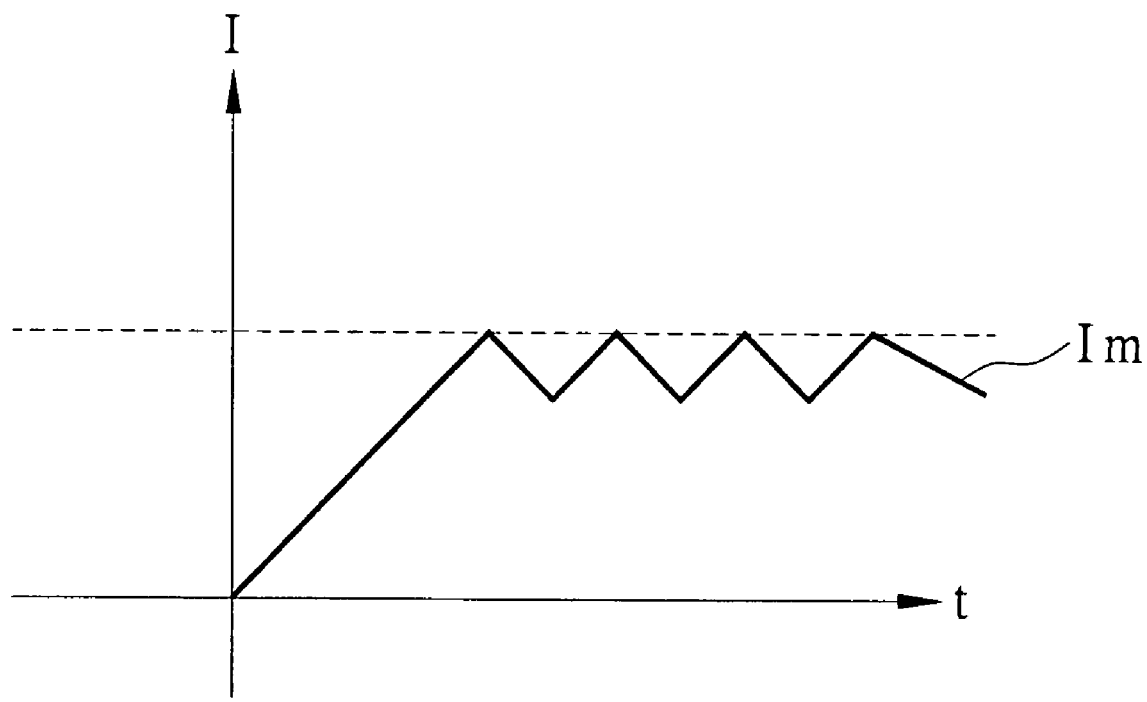
FIG. 2 is a waveform diagram of the operation current of the measuring apparatus of the prior art operating in voltage output mode.
Figure 3:
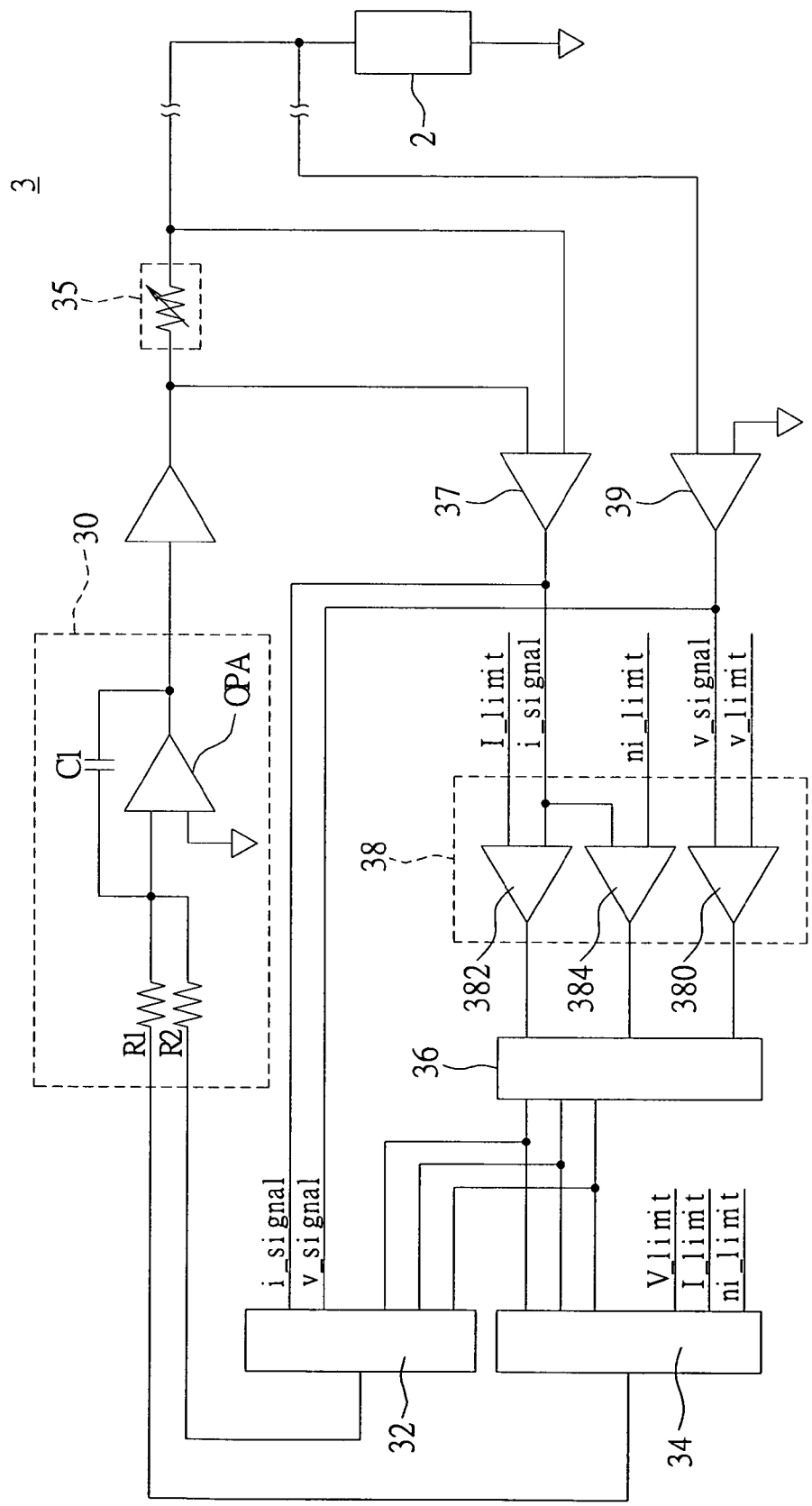
FIG. 3 is a circuit diagram of an apparatus for measuring the static parameters of an integrated circuit of the present invention.

Please refer to FIG. 3, which shows a circuit diagram of an apparatus for measuring the static parameters of an integrated circuit of the present invention. The apparatus 3 for measuring the static parameters of an integrated circuit of the present invention is used for testing the static parameters of a tested integrated circuit. The apparatus 3 for measuring the static parameters of integrated circuit includes a mode-selecting switch 34, a main control unit 30, a current sampling unit 37, a voltage-sampling unit 39, a comparing unit 38, a logic-judging unit 36 and a feedback-selecting switch 32.

In the apparatus 3 for measuring the static parameters of integrated circuit of the present invention, the mode-selecting switch 34 is an analog switch and is connected with the logic-judging unit 36. The mode-selecting switch 34 receives a voltage-limiting signal V_limit, a positive current limiting signal I_limit, and a negative current limiting signal ni_limit, and outputs one of the limiting signals according to a mode-selecting signal. The mode-selecting signal divides the operation mode of the apparatus 3 for measuring the static parameters of integrated circuit of the present invention into the voltage output mode, the current output mode, and the negative current output mode. When the apparatus 3 for measuring the static parameters of an integrated circuit is operated at the voltage output mode, the mode-selecting switch 34 selects the voltage-limiting signal V_limit to output. When the apparatus 3 for measuring the static parameters of an integrated circuit is operated at the current output mode, the mode-selecting switch 34 selects the positive current limiting signal I_limit to output. When the apparatus 3 for measuring the static parameters of integrated circuit is operated at the negative current output mode, the mode-selecting switch 34 selects the negative current limiting signal ni_limit to output.

The main control unit 30 is a negative direction integration circuit and is connected with the mode-selecting switch 34. The main control unit 30 receives one of the limiting signals to provide a testing signal to the tested integrated circuit 2. The testing signal is divided into the voltage-testing signal, the current testing signal, and negative current testing signal according the type of limiting signal. The described negative direction integration circuit includes a capacitor C1, an operation amplifier OPA, and at least one resistor R1 and R2.

The current sampling unit 37 obtains the current flowing through the tested integrated circuit 2 via a programmable resistor 35 and outputs a current sampling signal i_signal.

The current sampling unit 37 can be a differential amplifier. The voltage-sampling unit 39 obtains the voltage of the tested integrated circuit 2 and outputs a voltage-sampling signal v_signal. The voltage-sampling unit 39 can be a differential amplifier. The comparing unit 38 is connected with the current sampling unit 37 and the voltage-sampling unit 39 to receive the current sampling signal i_signal, the voltage-sampling signal v_signal, and the limiting signals. The comparing unit 38 compares the current sampling signal i_signal, and the voltage-sampling signal v_signal with the limiting signals to output a logic signal.

The comparing unit 38 includes a voltage comparator 380, a positive current comparator 382 and a negative current comparator 384. The voltage comparator 380 compares the voltage-sampling signal v_signal with the voltage-limiting signal V_limit. The positive current comparator 382 compares the current sampling signal i_signal with the positive current limiting signal I_limit. The negative current comparator 384 compares the current sampling signal i_signal with the negative current limiting signal ni_limit.

The logic-judging unit 36 is connected with the comparing unit 38 and receives the logic signal to output the mode-selecting signal. The feedback-selecting switch 32 is an analog switch and is connected with the main control unit 30, the current sampling unit 37 and the voltage-sampling unit 39. The feedback-selecting switch 32 selects and outputs one of either the current sampling signal i_signal or the voltage-sampling signal v_signal according to the mode-selecting signal. When the apparatus 3 for measuring the static parameters of an integrated circuit is operated at the voltage output mode, the feedback-selecting switch 32 selects the voltage-sampling signal v_signal to output. When the apparatus 3 for measuring the static parameters of an integrated circuit is operated at the current output mode or the negative current output mode, the feedback-selecting switch 32 selects the current sampling signal i_signal to output. The current feedback circuit of the apparatus 3 for measuring the static parameters of an integrated circuit of the present invention is composed of the main control unit 30, the current sampling unit 37, and the feedback-selecting switch 32. The voltage feedback circuit of the apparatus 3 for measuring the static parameters of integrated circuit of the present invention is composed of the main control unit 30, the voltage-sampling unit 39, and the feedback-selecting switch 32.

Figure 4:
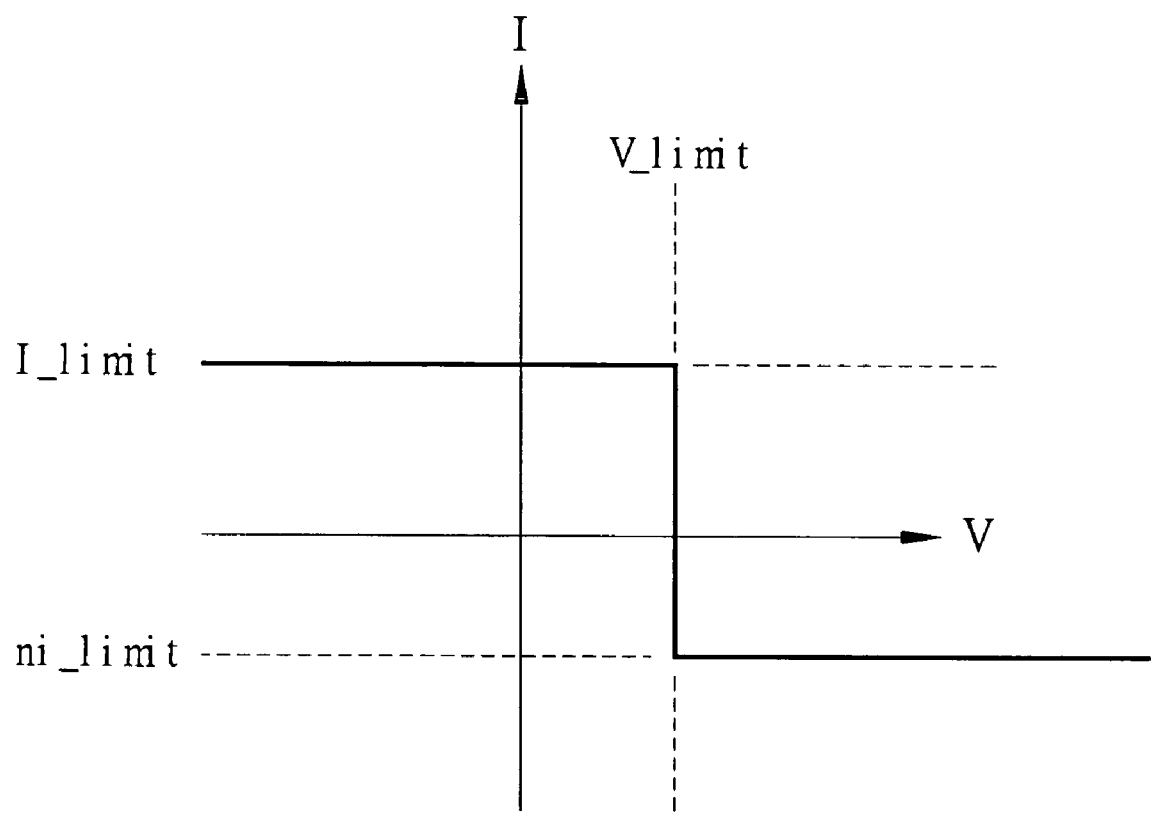
FIG. 4 is a coordinates diagram of the operation voltage vs. the operation current of the present invention.

Please refer to FIG. 3 and FIG. 4. FIG. 4 shows a coordinates diagram of the operation voltage vs. the operation current of the present invention. In FIG. 4, the Y-coordinate represents the operation current I, and the X-coordinate represents the operation voltage. When the apparatus 3 for measuring the static parameters of an integrated circuit of the present invention is used for testing the tested integrated circuit 2, the operation mode is divided into the voltage output mode, the current output mode, and the negative current output mode. When the apparatus 3 for measuring the static parameters of integrated circuit is operated at the voltage output mode, the mode-selecting switch 34 is controlled to select the voltage-limiting signal V_limit to output. The feedback-selecting switch 32 is controlled to select the voltage-sampling signal v_signal to output. Therefore, the apparatus 3 for measuring the static parameters of integrated circuits stably outputs the voltage-testing signal via the voltage feedback method and measures the current flowing through the tested integrated circuit 2. The positive current limiting signal I_limit and the negative current limiting signal ni_signal are used for limiting the current flowing through the tested integrated circuit 2 to prevent an over current from generating and damaging the tested integrated circuit 2 and the apparatus 3 for measuring the static parameters of integrated circuit.

When the apparatus 3 for measuring the static parameters of integrated circuit is operated at the voltage output mode and the current flowing through the tested integrated circuit 2 surpasses the pre-determined positive current limiting signal I_limit, the operation mode of the apparatus 3 for measuring the static parameters of integrated circuit will change to the current output mode. The mode-selecting switch 34 is controlled to select the current limiting signal I_limit to output. The feedback-selecting switch 32 is controlled to select the current sampling signal i_signal to output. Therefore, the apparatus 3 for measuring the static parameters of integrated circuits stably outputs the current testing signal via the current feedback method and measures the voltage of the tested integrated circuit 2. The voltage-limiting signal V_limit is used for limiting the voltage of the tested integrated circuit 2 to prevent the over voltage from generating and damaging the tested integrated circuit 2 and the apparatus 3 for measuring the static parameters of integrated circuit.

When the apparatus 3 for measuring the static parameters of integrated circuits is operated at the voltage output mode and the current flowing through the tested integrated circuit 2 is below the pre-determined negative current limiting signal ni_limit, the operation mode of the apparatus 3 for measuring the static parameters of integrated circuit changes to the negative current output mode. The mode-selecting switch 34 is controlled to select the current limiting signal ni_limit to output. The feedback-selecting switch 32 is controlled to select the current sampling signal i_signal to output. Therefore, the apparatus 3 for measuring the static parameters of an integrated circuit stably outputs the negative current testing signal via the current feedback method and measures the voltage of the tested integrated circuit 2. The voltage-limiting signal V_limit is used for limiting the voltage of the tested integrated circuit 2 to prevent the over voltage from generating and damaging the tested integrated circuit 2 and the apparatus 3 for measuring the static parameters of integrated circuits.

Therefore, the present invention provides an apparatus for measuring the static parameters of integrated circuits. When the apparatus is operated, the output mode is determined automatically according to the load of the integrated circuit. When the apparatus is operated at voltage output mode, the apparatus automatically limits the current. When the apparatus is operated at current output mode, the apparatus automatically limits the voltage. Therefore, the operation voltage and the operation current are stabilized. When the tested integrated circuit fails, the apparatus of the present invention can protect itself according to the stable operation voltage and operation current, and doesn't damage the tested integrated circuit.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An apparatus for measuring the static parameters of integrated circuits, used for testing the static parameters of a tested integrated circuit, comprising:

a mode-selecting switch receiving at least one limiting signal and outputting one of the limiting signals according to a mode-selecting signal;

a main control unit providing a testing signal to the tested integrated circuit according to one of the limiting signals;

a current sampling unit obtaining the current flowing through the tested integrated circuit and outputting a current sampling signal;

a voltage-sampling unit obtaining the voltage of the tested integrated circuit and outputting a voltage-sampling signal;

a comparing unit comparing the current sampling signal and the voltage-sampling signal with the limiting signals to output a logic signal;

a logic-judging unit receiving the logic signal and outputting the mode-selecting signal; and a feedback-selecting switch connected with the main control unit, the current sampling unit and the voltage-sampling unit, wherein the feedback-selecting switch outputs one of the current sampling signal and the voltage-sampling signal according to the mode-selecting signal.

2. The apparatus for measuring the static parameters of integrated circuits as claimed in claim 1, wherein the main control unit, the current sampling unit and the feedback-selecting switch form a current feedback circuit.

3. The apparatus for measuring the static parameters of integrated circuits as claimed in claim 1, wherein the main control unit, the voltage-sampling unit and the feedback-selecting switch form a voltage feedback circuit.

4. The apparatus for measuring the static parameters of integrated circuits as claimed in claim 1, wherein the limiting signals comprises a voltage-limiting signal, a positive current limiting signal, and a negative current limiting signal.

5. The apparatus for measuring the static parameters of integrated circuits as claimed in claim 4, wherein the comparing unit comprises a voltage comparator, a positive current comparator, and a negative current comparator, wherein the voltage comparator compares the voltage-sampling signal with the voltage-limiting signal, the positive current comparator compares the current sampling signal with the positive current limiting signal, and the negative current comparator compares the current sampling signal with the negative current limiting signal.

6. The apparatus for measuring the static parameters of integrated circuits as claimed in claim 1, wherein the main control unit is a negative direction integration circuit.

7. The apparatus for measuring the static parameters of integrated circuits as claimed in claim 6, wherein the negative direction integration circuit comprises a capacitor, an operation amplifier, and at least one resistor.

8. The apparatus for measuring the static parameters of integrated circuits as claimed in claim 1, wherein the current sampling unit obtains the current flowing through the tested integrated circuit via a programmable resistor.

9. The apparatus for measuring the static parameters of integrated circuits as claimed in claim 1, wherein the mode-selecting switch is an analog switch.

10. The apparatus for measuring the static parameters of integrated circuits as claimed in claim 1, wherein the feedback-selecting switch is an analog switch.

* * * * *